United States Patent [19]
Chang

[11] Patent Number: 5,457,418
[45] Date of Patent: Oct. 10, 1995

[54] TRACK AND HOLD CIRCUIT WITH AN INPUT TRANSISTOR HELD ON DURING HOLD MODE

[75] Inventor: Ronald Chang, Fremont, Calif.

[73] Assignee: National Semiconductor Corporation, Santa Clara, Calif.

[21] Appl. No.: 349,240

[22] Filed: Dec. 5, 1994

[51] Int. Cl.⁶ .............................. H03K 17/04; H03K 5/00
[52] U.S. Cl. .................. 327/374; 327/376; 327/91; 327/94
[58] Field of Search ........................ 327/374, 375, 327/376, 94, 95, 96

[56] References Cited

U.S. PATENT DOCUMENTS

| | | | |
|---|---|---|---|
| 4,125,787 | 11/1978 | Ohhinata et al. | 307/252 A |
| 4,366,522 | 12/1982 | Baker | 361/91 |
| 4,399,500 | 4/1983 | Clarke et al. | 363/97 |
| 4,461,979 | 7/1984 | Jeenicke et al. | 315/209 T |
| 4,508,976 | 4/1985 | Hickman et al. | 307/270 |
| 4,629,971 | 12/1986 | Kirk | 323/289 |
| 4,695,865 | 9/1987 | Wagenaar | 357/41 |
| 4,792,705 | 12/1988 | Ouyang et al. | 307/296 R |
| 4,847,520 | 7/1989 | O'Neill et al. | 307/296.1 |
| 4,868,419 | 9/1989 | Austin | 307/440 |

OTHER PUBLICATIONS

Kazuya Sone et al, "A 10b 100Ms/s Pipeline Subranging BiCMOS ADC", 1993 IEEE International Solid State Circuits Conference, pp. 66–67.

Primary Examiner—Timothy P. Callahan
Assistant Examiner—Kenneth B. Wells
Attorney, Agent, or Firm—William L. Paradice, III; Paul J. Winters; Skjerven, Morrill

[57] ABSTRACT

A track and hold circuit is disclosed which may be used in high speed analog to digital conversions. The circuit includes a control transistor which keeps the circuit's input transistor in a conductive state even when the circuit is in hold mode. As a result, the track and hold circuit achieves a high switching speed while minimizing input voltage spikes.

16 Claims, 3 Drawing Sheets

TRACK AND HOLD CIRCUIT WITH AN INPUT TRANSISTOR HELD ON DURING HOLD MODE

FIELD OF THE INVENTION

This invention relates to a track and hold circuit. More particularly, this invention relates to a track and hold circuit having improved switches which allow the track and hold circuit to be used with high speed analog-to-digital converters.

BACKGROUND OF THE INVENTION

Track and hold circuits (also known as sample and hold circuits) are especially useful in digital systems where an analog input signal is converted into a stream of digital values. The track and hold circuit follows the analog input signal and at predetermined intervals holds the input voltage so that it may be converted to a digital value.

FIG. 1 is a block diagram of a typical prior art track and hold circuit 10 having an input signal voltage provided at terminal 11. A clock signal is provided at a control terminal of switch 12 to control the on and off states of switch 12. During the track mode, switch 12 is on and passes the input signal to hold capacitor 13 which then charges or discharges to the input voltage. During the hold mode, switch 12 is turned off. Capacitor 13 holds the input voltage and provides the input voltage to unity gain buffer 14 which, in turn, provides the input voltage at output terminal 15.

Optimizing the performance of track and hold circuit 10 involves making undesirable compromises. First, since leakage currents in switch 12 and buffer 14 cause the voltage on capacitor 13 to droop (i.e., discharge) during hold mode, capacitor 13 should be large. If, however, high speed signals are to be followed accurately, capacitor 13 should be of a small value in order to avoid forming a low pass filter with the on-resistance of switch 12 which would undesirably restrict the input bandwidth of circuit 10. Second, increasing the input impedance of buffer 14 would advantageously minimize droop by minimizing current flow from capacitor 13 during hold mode. Such a high input impedance, however, would compromise the speed of circuit 10.

A further disadvantage of the prior art track and hold circuit of FIG. 1 is that the clock signal provided to switch 12 causes charge injection into capacitor 13 which, in turn, results in a significant pedestal error. In addition, the non-linearity of the on-resistance of MOS switch 12 causes distortion which varies according to changes in amplitude and frequency of the input signal voltage.

A track and hold circuit which overcomes many of the problems discussed above is disclosed by Kazuya Sone et al, "A 10b 100Ms/s Pipeline Subranging BiCMOS ADC", 1993 IEEE International Solid State Circuits Conference and shown in FIG. 2. Track and Hold circuit 20 includes two hold capacitors. Hold capacitor 22 holds the input voltage during hold mode, as does capacitor 12 of circuit 10, while hold capacitor 24, which is connected between output terminal 26 and the inverting terminal of buffer amplifier 28, minimizes voltage droop during hold mode.

Switch 30, which connects an input signal to capacitor 22 and buffer 28, is a bipolar current steering switch. A second bipolar current steering switch 32 is provided in parallel to hold capacitor 24. A clocking signal provided to both switches 30 and 32 simultaneously turns switches 30 and 32 on and off. The clocking signal provided to switch 32 causes charge injection into capacitor 24, resulting in a pedestal error which offsets any pedestal error caused by charge injection of hold capacitor 22.

The operation of track and hold circuit 20 is as follows. An input signal $V_{in}$ is applied to circuit 20 at the base of input transistor Q1 (terminal 42). A track mode clock signal ($CK_T$) is provided to circuit 20 at terminal 34 for turning on and off transistors Q3 and Q5. A hold mode clock signal ($CK_H$) is provided to circuit 20 at terminal 36 for turning on and off transistors Q4 and Q6.

In track mode, $CK_T$ goes high and turns on transistors Q3 and Q5. Transistor Q3 turns on transistor Q1 and diode-connected transistors $D_4$ and $D_5$. Transistor Q5 turns on output transistor Q2. $CK_H$ simultaneously goes low and turns off transistors Q4 and Q6. When in its off state, transistor Q4 ensures that diode-connected transistors D1, D2, and D3 are reversed biased and thus non-conducting. Current source 38 provides a bias current 2I through transistor Q3 which is evenly divided between transistor Q1 and diodes D5 and D4, i.e., transistor Q1 and diodes D4–D5 are each biased by a current approximately equal to I. Current source 40 provides a bias current 2I through transistor Q2 via transistor Q5.

Transistors Q1 and Q2 operate as emitter followers and diodes D4 and D5 operate as voltage level shifters. The input signal voltage $V_{in}$ applied at input terminal 42 appears at the emitter of transistor Q2 and charges hold capacitor 22. The voltage on hold capacitor 22 accurately follows the input voltage $V_{in}$ at terminal 42 as can be seen from the following equation:

$$V_{cap22} = V_{in} - V_{be,Q1} + V_{be,D5} + V_{be,D4} - V_{be,Q2} = V_{in}.$$

Note that during track mode no current flows through transistors D1–D3.

When circuit 20 transitions to hold mode, $CK_T$ goes low and turns off transistors Q3 and Q5. Transistor Q3 turns off transistor Q1 and diodes D4 and D5 to prevent feedthrough of the input voltage $V_{in}$ at terminal 42. When non-conducting transistor Q5, by ensuring that no current flows from hold capacitor 22 to ground, prevents capacitor 22 from discharging during hold mode. $CK_H$ simultaneously goes high and turns on transistors Q4 and Q6. Transistor Q6 provides a path to ground for current source 40. Source 38, via transistor Q4, pulls a current I from DC source 37 and a current I through diodes D1–D3. The current I through diodes D1–D3 turns on diodes D1–D3 which, in turn, pull the base of transistor Q2 to approximately 3 $V_{be}$ below ground to ensure that transistor Q2 remains off during hold mode. Further, since diodes D1–D3 hold the voltage at the base of transistor Q2 constant during hold mode, any parasitic feedthrough of the input voltage $V_{in}$ is effectively clamped during hold mode.

During hold mode, the non-conductive states of transistors Q1 and Q2 prevent further charging of hold capacitor 22, while the non-conductive state of transistor Q5 prevents hold capacitor 22 from discharging to ground via transistor Q5. Thus, during hold mode capacitor 22 is able to maintain a substantially constant voltage which is then provided to output terminal 26 via unity gain buffer 28.

The track and hold circuit described above with reference to FIG. 2 is problematic when switching from hold mode to track mode. Since input transistor Q1 and output transistor Q2 (as well as diodes D4 and D5) are turned off during hold mode, they must be turned back on when circuit 20 transitions from hold mode to track mode. The acquisition time of these transistors undesirably limits the speed of circuit 20. Further, as input transistor Q1 switches between on and off states as circuit 20 switches between track mode and hold mode, respectively, the base current of transistor Q1 will fluctuate between zero and I/B, where B is the Beta of transistor Q1. This base current fluctuation results in undesirable voltage spikes at input terminal 42.

Thus, there is a need for a track and hold circuit which has a faster switching capability and which does not suffer from voltage spikes at its input terminal.

SUMMARY OF THE INVENTION

An improved track and hold circuit is disclosed which overcomes problems in the prior art mentioned above. The track and hold circuit in accordance with the present invention includes a switching device having a control transistor coupled to an input transistor. During track mode, the switching device is in a conductive state to allow the hold capacitor to charge or discharge to an input voltage.

The control transistor ensures that the input transistor remains in a conductive state when the track and hold circuit transitions to hold mode (i.e., when the switching device is off). Since the input transistor is kept in a conductive state during hold mode, the input transistor does not require any acquisition time when the switching device transitions from hold to track mode. Accordingly, the speed of the switching device is increased.

Further, since the input transistor does not switch between conductive and non-conductive states, the input base current of the input transistor is substantially constant rather than fluctuating between zero and I/B. This substantially constant base current greatly reduces the input voltage spikes characteristic of prior art track and hold circuits.

DETAILED DESCRIPTION OF THE INVENTION

Figure 1:
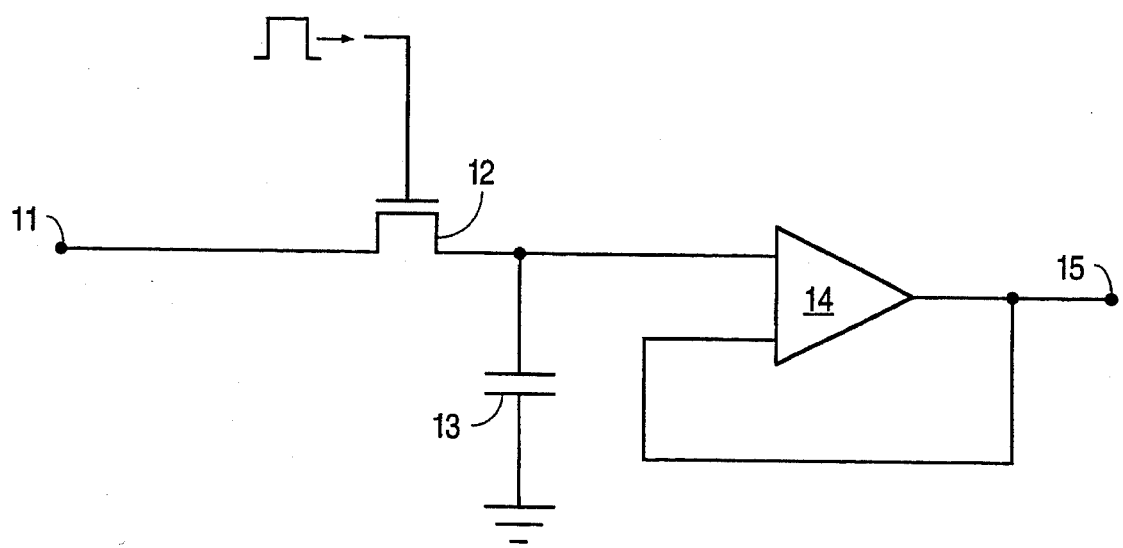
FIG. 1 is a block diagram of a typical prior art track and hold circuit.
Figure 2:
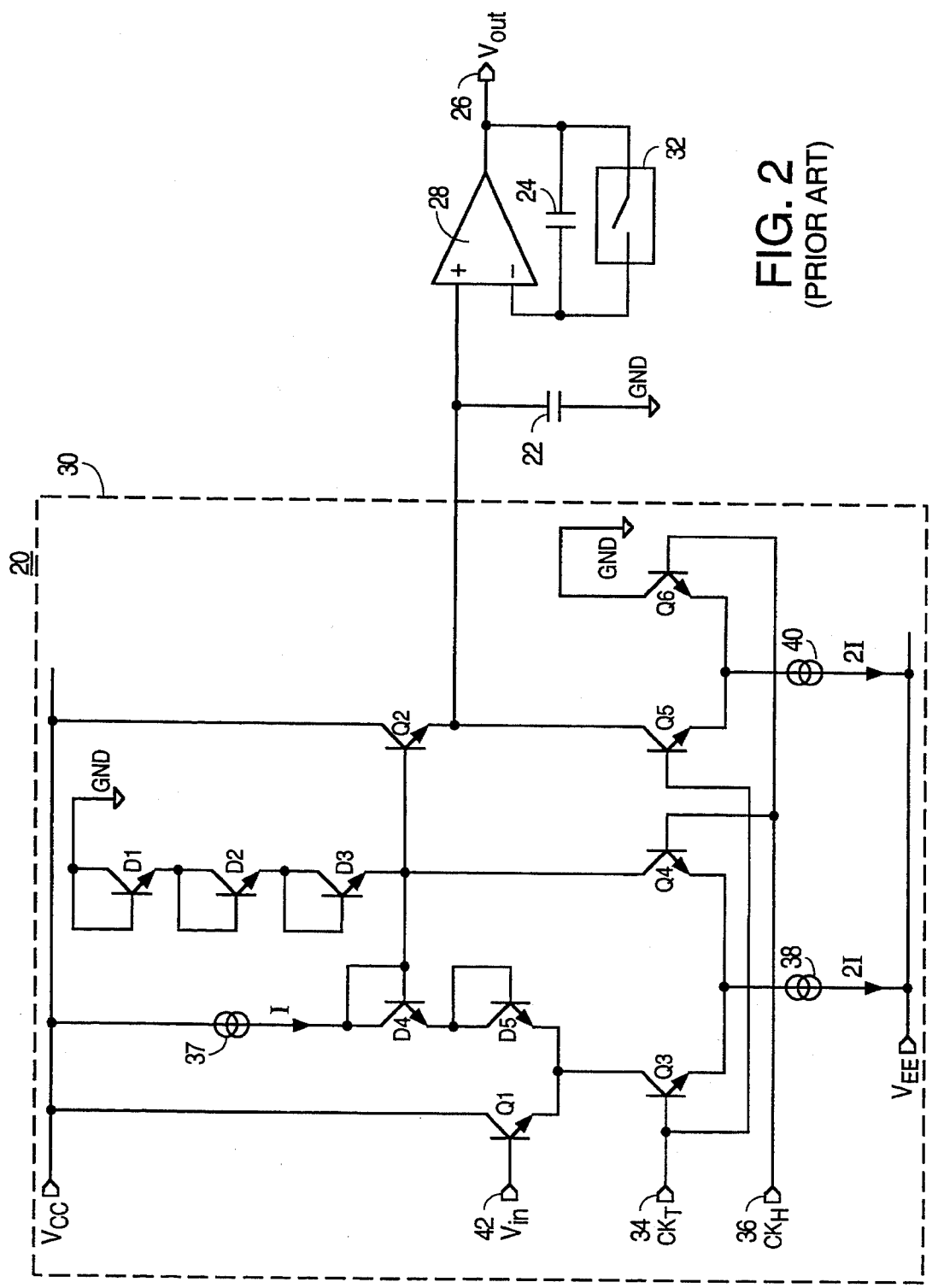
FIG. 2 is a schematic diagram of another prior art track and hold circuit.
Figure 3:
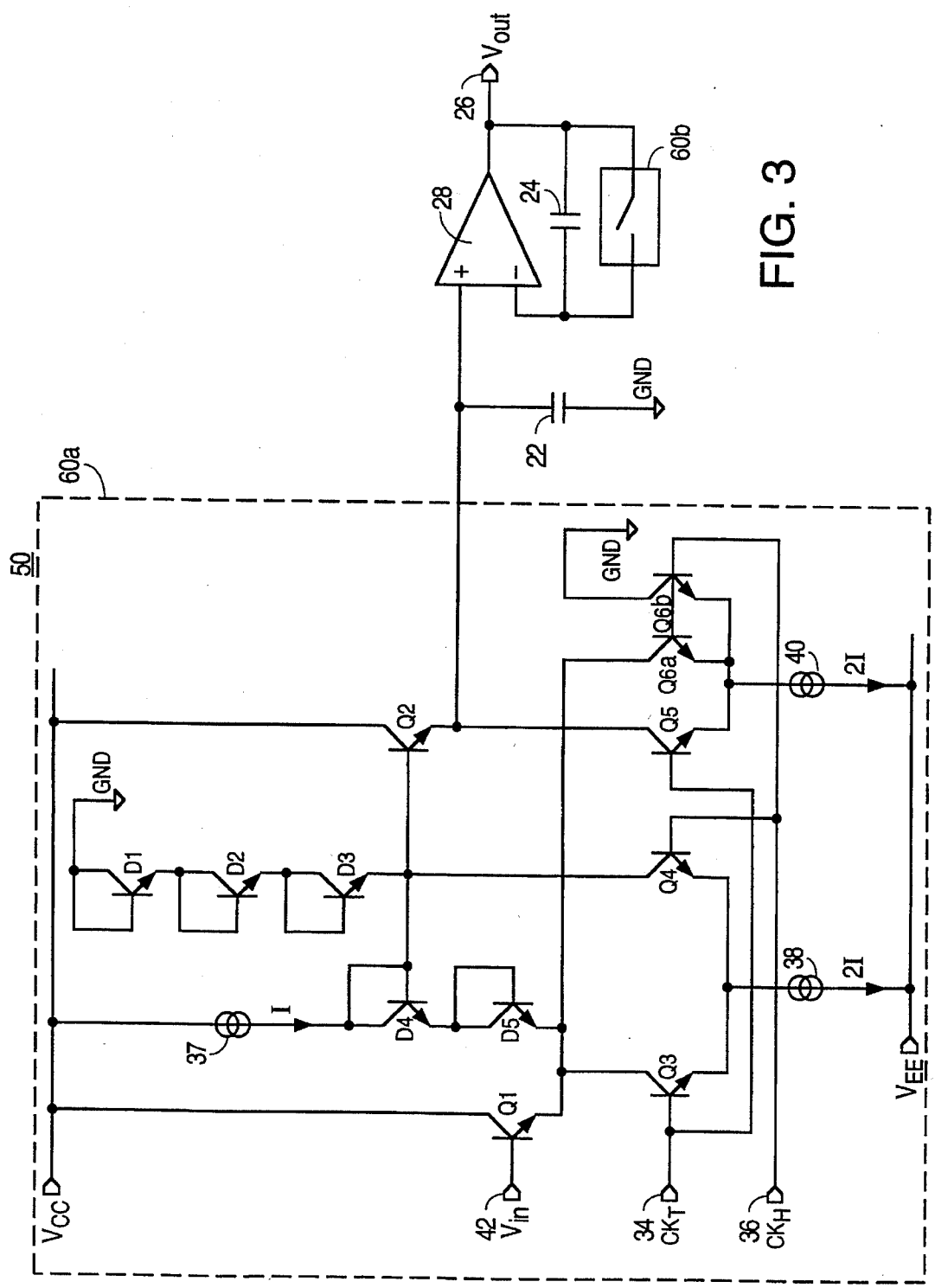
FIG. 3 is a schematic diagram of one embodiment in accordance with the present invention.

FIG. 3 shows a track and hold circuit 50 having switching devices 60a and 60b in accordance with the present invention. Those components depicted in FIG. 3 which are similar to and operate in the same manner as components in prior art track and hold circuit 20 (FIG. 2) are appropriately labelled with the same numerals.

In track mode, switches 60a and 60b are in a conducting state. A high $CK_T$ signal turns on transistor Q1 and diodes D4–D5 via transistor Q3 and turns on transistor Q2 via transistor Q5, while a low $CK_H$ signal turns off diodes D1, D2, and D3 via transistor Q4. As explained earlier, hold capacitor 22 charges to and tracks the input voltage signal $V_{in}$.

In hold mode, switches 60a and 60b are non-conducting. A low $CK_T$ signal turns off transistors Q3 and Q5. The voltage on capacitor 22 is provided to output terminal 26 via buffer 28. Switch 60b and capacitor 24 compensate for the pedestal error caused by switch 60a and hold capacitor 22, as discussed above.

A high $CK_H$ signal turns on transistors Q4, Q6a and Q6b.

As discussed earlier, transistor Q4 turns on diodes D1–D3 which, in turn, ensure that transistor Q2 remains off during hold mode. Transistors Q6a and Q6b each have a cross-sectional area equal to approximately half that of each of transistors Q3, Q4, and Q5. Transistor Q6b sinks a current of approximately I from ground to current source 40, while transistor Q6a sinks a current of approximately I from input transistor Q1 to current source 40. In other words, the current flowing through transistor Q1 during hold mode is approximately equal to the current flowing through transistor Q1 during track mode. Thus, transistor Q1 remains in a conductive state during hold mode irrespective of the non-conducting state of transistor Q3.

The embodiment described above in reference to FIG. 3 exhibits superior performance over previous track and hold circuits. When circuit 50 switches from hold to track mode, i.e., when clock signals $CK_T$ and $CK_H$ turn on switch 60a, input transistor Q1 is already conductive and thus does not need to be turned on. As a result, circuit 50 requires less acquisition time when transitioning from hold mode to track mode and, accordingly, achieves an increased switching speed. Furthermore, by keeping transistor Q1 active during hold mode, the base current of transistor Q1 remains substantially constant. This feature is advantageous since a constant base current at input terminal 42 will minimize voltage spikes present terminal 42 during transitions between hold and track mode.

It is to be understood that although circuit 50 includes three diodes D1–D3 connected between ground and the base of transistor Q2, additional diodes may be provided in series with diodes D1–D3 to allow operation with higher input voltage $V_{in}$ swings. Accordingly, where input voltage $V_{in}$ swings are minimal, fewer than three diodes may be employed.

All of the transistors mentioned above and depicted in FIG. 3 are preferably NPN transistors. Note, however, that PNP transistors may also be used (with the polarities reversed), as well as MOS or CMOS transistors, without any resultant degradation in performance. In one embodiment, switch 60b is identical to and operates in the same manner as switch 60a.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A switching device having an input terminal and an output terminal and having a conductive state and a non-conductive state, said switching device comprising:

an input transistor having a base coupled to said input terminal for receiving an input signal at said input terminal and having an emitter, said input transistor having an on state and an off state;

a first transistor having a collector coupled to said emitter of said input transistor, said first transistor driving said input transistor into said on state when said switching device is in said conductive state; and a second transistor having a collector coupled to said emitter of said input transistor, said second transistor keeping said input transistor in said on state when said switching device is in said non-conductive state.

2. The switching device of claim 1 further comprising an output transistor having a base electrically coupled to said emitter of said input transistor so as to receive a signal from said input transistor and for providing an output signal at said output terminal.

3. The switching device of claim 2 further comprising:
   a first diode having a cathode coupled to said emitter of said input transistor; and
   a second diode having a cathode coupled to an anode of said first diode and having an anode coupled to a base of said output transistor.

4. The switching device of claim 3 wherein said input transistor and said output transistor comprise emitter-follower transistors.

5. The switching device of claim 3 wherein said first and second diodes comprise diode-connected transistors.

6. The switching device of claim 1 wherein the area factor of said first transistor is approximately double the area factor of said second transistor.

7. A switching device comprising:
   an input transistor having a base coupled to an input terminal of said switching device for receiving an input signal at said input terminal of said switching device;
   a first transistor having a base coupled to a first control terminal for receiving a control signal and having a collector coupled to an emitter of said input transistor, said first transistor causing said input transistor to be in a conductive state when said switching device is in a conductive state;
   a second transistor having a base coupled to a second control terminal for receiving a second control signal and having a collector coupled to said emitter of said input transistor, said second transistor causing said input transistor to be in a conductive state when said switching device is in a non-conductive state.

8. The switching device of claim 7 further comprising:
   an output transistor having an emitter coupled to an output terminal of said switching device;
   a first diode having a cathode coupled to said emitter of said input transistor; and
   a second diode having a cathode coupled to an anode of said first diode and having an anode coupled to a base of said output transistor.

9. The switching device of claim 8 further comprising a diode element having a cathode coupled to said base of said output transistor and having an anode coupled to a fixed potential, said diode element causing said output transistor to be in a non-conductive state when said switching device is in said non-conductive state.

10. The switching device of claim 9 further comprising a third transistor having a collector coupled to said cathode of said diode element and having a base coupled to receive said second control signal, said third transistor controlling the on and off states of said diode element.

11. The switching device of claim 10 wherein said diode element further comprises a plurality of diode-connected transistors.

12. The switching device of claim 11 further comprising a first current source coupled to an emitter of said first transistor and to an emitter of said third transistor.

13. The switching device of claim 12 further comprising a second current source coupled to an emitter of said second transistor.

14. The switching device of claim 13 further comprising a fourth transistor having a collector coupled to said emitter of said output transistor and having a base coupled to receive said first control signal, said fourth transistor having an emitter coupled to said second current source, wherein said fourth transistor provides a bias current to said output transistor when said switching device is in said on state.

15. The switching device of claim 14 wherein said first, second, third, and fourth transistors comprise NPN transistors.

16. The switching device of claim 8 wherein said first and second diodes comprise diode-connected NPN transistors.

* * * * *